United States Patent
Cha et al.

(10) Patent No.: US 10,503,589 B2
(45) Date of Patent: Dec. 10, 2019

(54) SEMICONDUCTOR MEMORY DEVICES, MEMORY SYSTEMS AND METHODS OF OPERATING SEMICONDUCTOR MEMORY DEVICES

(71) Applicant: SAMSUNG ELECTRONICS CO., LTD., Suwoni-si (KR)

(72) Inventors: Sang-Uhn Cha, Yongin-si (KR); Myeong-O Kim, Hwaseong-si (KR); In-Woo Jun, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/023,835

(22) Filed: Jun. 29, 2018

(65) Prior Publication Data

US 2019/0146870 A1  May 16, 2019

(30) Foreign Application Priority Data

Nov. 14, 2017  (KR) .......................... 10-2017-0151195

(51) Int. Cl.
| | |
|---|---|
| *G06F 11/10* | (2006.01) |
| *G11C 29/52* | (2006.01) |
| *H03M 13/29* | (2006.01) |
| *G06F 3/06* | (2006.01) |
| *G11C 29/04* | (2006.01) |

(52) U.S. Cl.
CPC ........ *G06F 11/1068* (2013.01); *G06F 3/0619* (2013.01); *G06F 3/0659* (2013.01); *G06F 3/0679* (2013.01); *G06F 11/1048* (2013.01); *H03M 13/2906* (2013.01); *G11C 29/52* (2013.01); *G11C 2029/0411* (2013.01)

(58) Field of Classification Search
CPC .. G06F 11/1068; G06F 3/0619; G06F 3/0659; G06F 3/0679; G06F 11/1048; H03M 13/2906; G11C 29/52; G11C 2029/0411
See application file for complete search history.

(56) References Cited

U.S. PATENT DOCUMENTS

| | | | |
|---|---|---|---|
| 7,587,658 B1 * | 9/2009 | Tong | ................... G06F 11/1012 714/763 |
| 8,880,974 B2 | 11/2014 | Pawlowski et al. | |
| 8,959,417 B2 | 2/2015 | Zhu et al. | |
| 9,520,901 B2 | 12/2016 | Suzuki et al. | |
| 9,589,674 B2 | 3/2017 | Son et al. | |

(Continued)

*Primary Examiner* — Kyle Vallecillo
(74) *Attorney, Agent, or Firm* — Sughrue Mion, PLLC

(57) ABSTRACT

Semiconductor memory device may include a memory cell array, an error correction circuit, an input/output (I/O) gating circuit and a control logic circuit. The control logic circuit may, in a first write operation mode, control the I/O gating circuit to select a sub-page, read a first unit of data including a first sub unit of data, a second sub unit of data and a first parity data from the sub-page, and provide the first unit of data to the error correction circuit. The control logic circuit may also control the error correction circuit to perform an error-correcting code decoding on the first unit of data to generate syndrome data, generate second parity data based on a portion of the first unit of data and generate third parity data based on a write parity data, the second parity data and the syndrome data.

20 Claims, 16 Drawing Sheets

(56) References Cited

U.S. PATENT DOCUMENTS

| | | | |
|---|---|---|---|
| 2008/0082869 A1* | 4/2008 | Sugawara | G06F 11/1016 714/702 |
| 2011/0029841 A1* | 2/2011 | Rho | G06F 11/1068 714/763 |
| 2011/0225475 A1* | 9/2011 | Kumar | G06F 11/1052 714/763 |
| 2014/0032992 A1* | 1/2014 | Hara | G06F 12/0246 714/773 |
| 2015/0178155 A1 | 6/2015 | Kim et al. | |
| 2016/0163376 A1 | 6/2016 | Bains et al. | |
| 2016/0283318 A1 | 9/2016 | Das et al. | |
| 2016/0350181 A1* | 12/2016 | Cha | G06F 11/1068 |
| 2016/0372161 A1* | 12/2016 | Chae | H03M 13/6325 |
| 2017/0060681 A1 | 3/2017 | Halbert et al. | |
| 2017/0109232 A1 | 4/2017 | Cha et al. | |
| 2018/0074895 A1* | 3/2018 | Choi | G11C 29/52 |

* cited by examiner

SEMICONDUCTOR MEMORY DEVICES, MEMORY SYSTEMS AND METHODS OF OPERATING SEMICONDUCTOR MEMORY DEVICES

CROSS-REFERENCE TO RELATED APPLICATION

This application claims priority from Korean Patent Application No. 10-2017-0151195, filed on Nov. 14, 2017 in the Korean Intellectual Property Office, the disclosure of which is incorporated herein in its entirety by reference.

BACKGROUND

1. Field

Apparatuses and methods consistent with example embodiments relate to memories, and more particularly to semiconductor memory devices, memory systems and methods of operating semiconductor memory devices.

2. Description of the Related Art

Semiconductor memory devices may be classified as non-volatile memory devices such as flash memory devices or volatile memory devices such as dynamic random access memories (DRAMs). High speed operation and cost efficiency of DRAMs make it possible for DRAMs to be used for system memories. In order to achieve higher yields from its fabrication process, the manufacturing process has continued to be scaled down in size, and consequently bit errors of memory cells in the DRAMs have steadily increased. Therefore, there is a need for improving the integrity of the semiconductor memory device.

SUMMARY

According to an aspect of an example embodiment, a semiconductor memory device may include a memory cell array, an error correction circuit, an input/output (I/O) gating circuit and a control logic circuit. The I/O gating circuit may be connected between the error correction circuit and the memory cell array. The control logic circuit may generate control signals by decoding a command received from an external memory controller. The control logic circuit may, in a first write operation mode, control the I/O gating circuit and the error correction circuit such that the I/O gating circuit selects a sub-page of a target page, reads a first unit of data including (i) a first sub unit of data, (ii) a second sub unit of data and (iii) a first parity data from the sub-page, and provides the first unit of data to the error correction circuit. The control logic circuit may also control the error correction circuit to perform an error-correcting code (ECC) decoding on the first unit of data to generate syndrome data, generate second parity data based on a portion of the first unit of data and generate third parity data based on write parity data, the second parity data and the syndrome data. The write parity data may be provided from the external memory controller and may be associated with main data to be written in the sub-page.

According to an aspect of an example embodiment, a memory system may include at least one semiconductor memory device and a memory controller configured to control the at least one semiconductor memory device. The semiconductor memory device may include a memory cell array, an error correction circuit, an input/output (I/O) gating circuit and a control logic circuit. The I/O gating circuit may be connected between the error correction circuit and the memory cell array. The control logic circuit may generate control signals by decoding a command received from the memory controller. The control logic circuit may, in a first write operation mode, control the I/O gating circuit and the error correction circuit such that the I/O gating circuit selects a sub-page of a target page, reads a first unit of data including (i) a first sub unit of data, (ii) a second sub unit of data and (iii) a first parity data from the sub-page, and provides the first unit of data to the error correction circuit. The control logic circuit may also control the error correction circuit to perform an error-correcting code (ECC) decoding on the first unit of data to generate syndrome data, generate second parity data based on a portion of the first unit of data and generate third parity data based on write parity data, the second parity data and the syndrome data. The write parity data may be provided from the memory controller and may be associated with main data to be written in the sub-page.

According to an aspect of an example embodiment, a method of operating a semiconductor memory device including a memory cell array, may include receiving a command, an address, main data, a data mask signal and write parity data associated with the main data from an external memory controller, generating second parity data and check bits based on a portion of a first unit of data including (i) a first sub unit of data, (ii) a second sub unit of data and (iii) a first parity data read from a memory region corresponding to the address, generating syndrome data based on the first parity data and the check bits, generating third parity data based on the write parity data, the second parity data and the syndrome data, and writing the main data and the third parity data in the memory region. The second parity data may be generated based on one of the first sub unit of data and the second sub unit of data in response to the data mask signal.

Accordingly, when the semiconductor memory device is to perform a masked write operation, the semiconductor memory device may receive the main data and the write parity data from the memory controller, and perform an internal read-modify-write operation by generating a parity data and a syndrome data based on a first unit of data read from a memory location in which the main data to be stored, and generating new parity data to be stored in the memory location based on the write parity data, the syndrome data and the parity data. Therefore, the semiconductor memory device may enhance performance at a system level, reduce power consumption and decrease the time required to perform the internal read-modify-write operation because the semiconductor memory device is able to perform the write operation and error correction operation in response to one command.

BRIEF DESCRIPTION OF THE DRAWINGS

The above and/or other aspects will become apparent and more readily appreciated from following description of example embodiments, taken in conjunction with accompanying drawings in which.

DETAILED DESCRIPTION

Various example embodiments will be described more fully hereinafter with reference to the accompanying drawings, in which example embodiments are shown.

Figure 1:
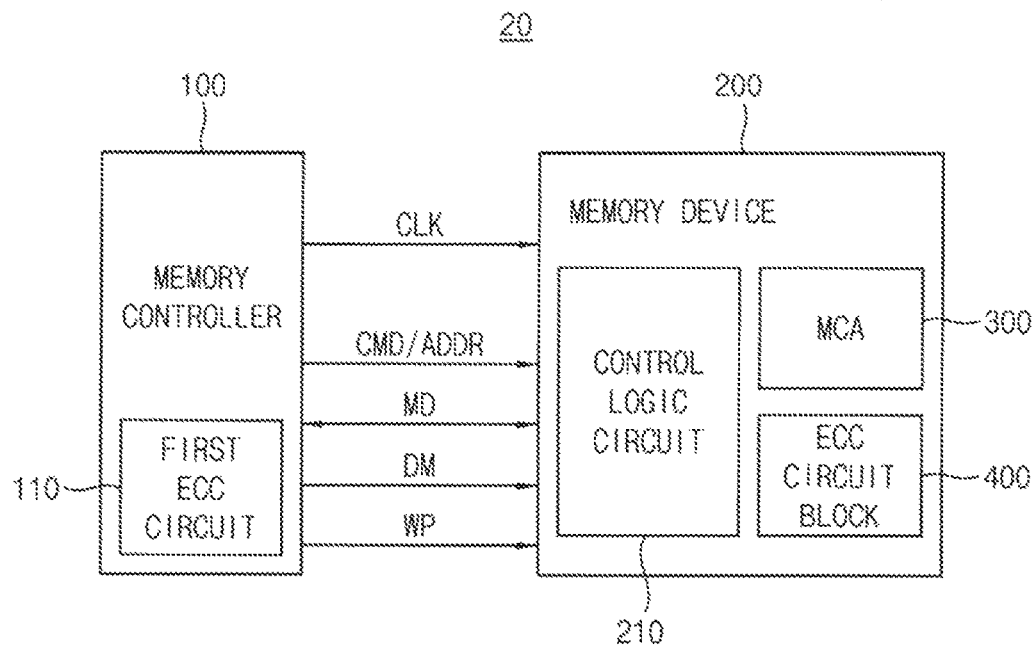
FIG. 1 is a block diagram illustrating a memory system according to an example embodiment.

FIG. 1 is a block diagram illustrating a memory system according to an example embodiment.

Referring to FIG. 1, a memory system 20 may include a memory controller 100 (e.g., an external memory controller) and at least one semiconductor memory device 200.

The memory controller 100 may control the overall operation of the memory system 20. The memory controller 100 may control the overall data exchange between an external host and the semiconductor memory device 200. For example, the memory controller 100 may write data in the semiconductor memory device 200 or read data from the semiconductor memory device 200 in response to request from the host.

In addition, the memory controller 100 may issue operation commands to the semiconductor memory device 200 for controlling the semiconductor memory device 200. The memory controller 100 may include a first error correction circuit 110. The first error correction circuit 110, which is denoted by a first ECC circuit, may be referred to as a first error-correcting code (ECC) circuit.

In some example embodiments, the semiconductor memory device 200 is a memory device including a plurality of dynamic memory cells such as a dynamic random access memory (DRAM), double data rate 4 (DDR4) synchronous DRAM (SDRAM) or a low power DDR4 (LPDDR4) SDRAM.

The memory controller 100 transmits a clock signal CLK, a command CMD, an address (signal) ADDR, a write parity data WP and a data mask signal DM to the semiconductor memory device 200 and exchanges main data MD with the semiconductor memory device 200. The first error correction circuit 110 performs an ECC encoding on the main data MD using a first ECC to generate the write parity data WP. The data mask signal DM may indicate whether the main data MD is masked. That is, the data mask signal DM may indicate whether a size of the main data MD is smaller than a size of a codeword of the semiconductor memory device 200.

The semiconductor memory device 200 includes a memory cell array 300 that stores the main data MD, an error correction circuit block 400 and a control logic circuit 210. The error correction circuit block 400 may include a plurality of second error correction circuits corresponding to a plurality of bank arrays included in the memory cell array 300.

One of the plurality of second error correction circuits, connected to one bank array may select a sub-page of a target page, read a first unit of data including a first sub unit of data, a second sub unit of data and parity data from the sub-page, perform an ECC decoding on the first unit of data to generate a syndrome data, generate a second parity data based on a portion of the first unit of data and generate a third parity data based on a write parity data, the second parity data and the syndrome data. The write parity data WP is provided from the memory controller 100 and is associated with the main data MD to be written in the sub-page.

Figure 2:
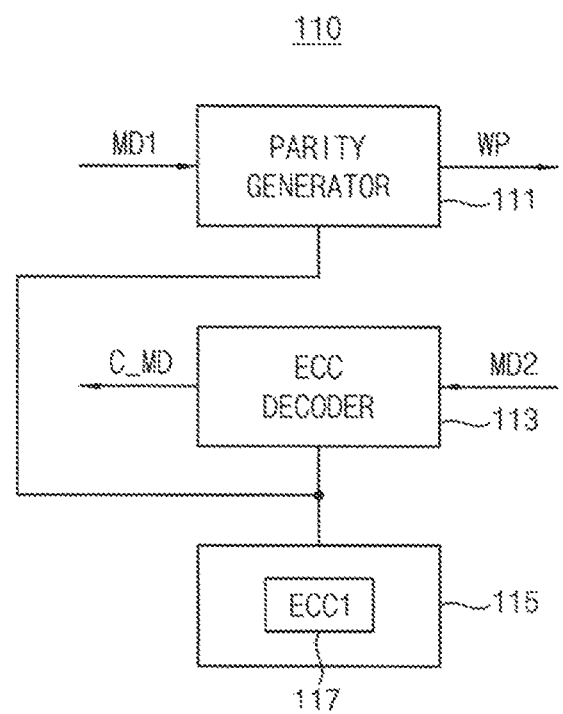
FIG. 2 is a block diagram illustrating a first error correction circuit in the memory controller in FIG. 1 according to an example embodiment.

FIG. 2 is a block diagram illustrating a first error correction circuit in the memory controller in FIG. 1 according to an example embodiment.

Referring to FIG. 2, the first error correction circuit 110 may include a parity generator 111, an ECC decoder 113 and a memory 115. The memory 115 may store a first ECC 117 and is coupled to the parity generator 111 and the ECC decoder 113. The first ECC 117 may be represented as a generation matrix.

The parity generator 111 may generate the write parity data WP by performing an ECC encoding on main data MD1 to be sent to the semiconductor memory device 200, by using the first ECC 117. For example, when the main data MD1 includes 64 bits, the write parity data WP may include 8 bits.

The ECC decoder 113 performs an ECC decoding on main data MD2 received from the semiconductor memory device 200 by using the first ECC 117, corrects at least one error bit in the main data MD2 and outputs a corrected main data C_MD. The ECC decoder 113 provides the corrected main data C_MD to the host.

Figure 3:
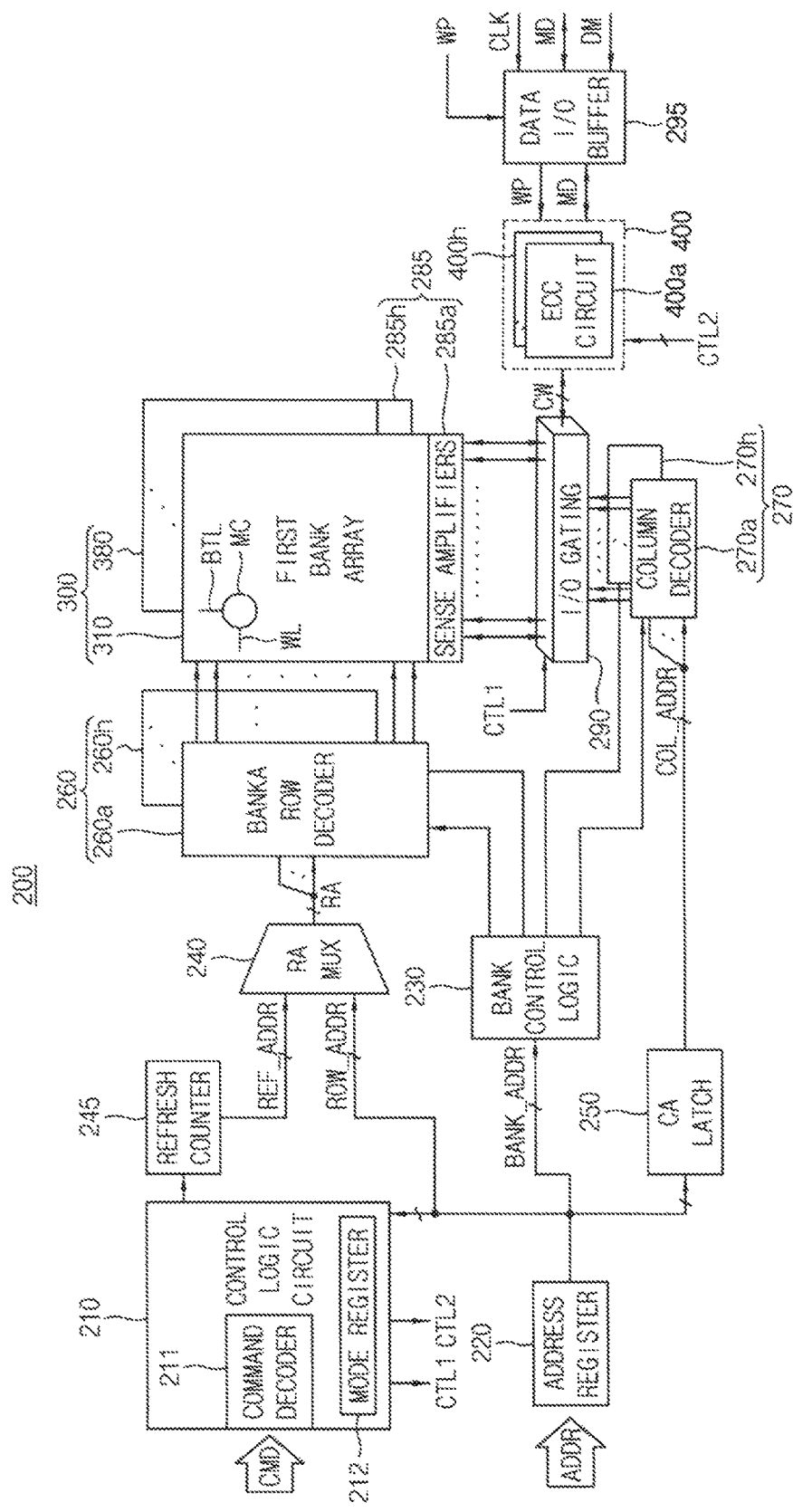
FIG. 3 is a block diagram illustrating the semiconductor memory device in FIG. 1 according to an example embodiment.

FIG. 3 is a block diagram illustrating the semiconductor memory device in FIG. 1 according to an example embodiment.

Referring to FIG. 3, the semiconductor memory device 200 includes a control logic circuit 210, an address register 220, a bank control logic 230, a refresh counter 245, a row address multiplexer 240, a column address latch 250, a row decoder 260, a column decoder 270, the memory cell array 300, a sense amplifier unit 285, an I/O gating circuit block 290, the error correction circuit block 400, and a data I/O buffer 295.

The error correction circuit block 400 includes a plurality of second error correction circuits 400a-400h, and the I/O gating circuit block 290 includes a plurality of I/O gating circuits corresponding to a plurality of bank arrays. An additional error correction circuit (e.g., the first error correction circuit 110 of FIG. 1) may be included in the memory controller 100.

The memory cell array 300 includes first through eighth bank arrays 310-380. The row decoder 260 includes first through eighth bank row decoders 260a-260h respectively coupled to the first through eighth bank arrays 310-380, the column decoder 270 includes first through eighth bank column decoders 270a-270h respectively coupled to the first through eighth bank arrays 310-380, and the sense amplifier unit 285 includes first through eighth bank sense amplifiers 285a-285h respectively coupled to the first through eighth bank arrays 310-380. The first through eighth bank arrays 310-380, the first through eighth bank row decoders 260a-260h, the first through eighth bank column decoders 270a-270h and first through eighth bank sense amplifiers 285a-285h may form first through eighth banks. Each of the first through eighth bank arrays 310-380 includes a plurality of memory cells MC formed at intersections of a plurality of word-lines WL and a plurality of bit-line BTL.

The address register 220 receives the address ADDR including a bank address BANK_ADDR, a row address ROW_ADDR and a column address COL_ADDR from the memory controller 100. The address register 220 provides the received bank address BANK_ADDR to the bank control logic 230, provides the received row address ROW_ADDR to the row address multiplexer 240, and provides the received column address COL_ADDR to the column address latch 250.

The bank control logic 230 generates bank control signals in response to the bank address BANK_ADDR. One of the first through eighth bank row decoders 260a-260h corresponding to the bank address BANK_ADDR is activated in response to the bank control signals, and one of the first through eighth bank column decoders 270a-270h corresponding to the bank address BANK_ADDR is activated in response to the bank control signals.

The row address multiplexer 240 receives the row address ROW_ADDR from the address register 220, and receives a refresh row address REF_ADDR from the refresh counter 245. The row address multiplexer 240 selectively outputs the row address ROW_ADDR or the refresh row address REF_ADDR as a row address RA. The row address RA that is output from the row address multiplexer 240 is applied to the first through eighth bank row decoders 260a-260h.

The activated one of the first through eighth bank row decoders 260a-260h, by the bank control logic 230, decodes the row address RA that is output from the row address multiplexer 240, and activates a word-line corresponding to the row address RA. For example, the activated bank row decoder applies a word-line driving voltage to the word-line corresponding to the row address RA.

The column address latch 250 receives the column address COL_ADDR from the address register 220, and temporarily stores the received column address COL_ADDR. In some example embodiments, in a burst mode, the column address latch 250 generates column addresses that increment from the received column address COL_ADDR. The column address latch 250 applies the temporarily stored or generated column address to the first through eighth bank column decoders 270a-270h.

The activated one of the first through eighth bank column decoders 270a-270h activates a sense amplifier corresponding to the bank address BANK_ADDR and the column address COL_ADDR through the I/O gating circuit block 290. Each of the I/O gating circuits in the I/O gating circuit block 290 includes a circuitry for gating input/output data, and further includes read data latches for storing data that is output from the first through eighth bank arrays 310-380, and write drivers for writing data to the first through eighth bank arrays 310-380.

Codeword CW read from one bank array of the first through eighth bank arrays 310-380 is sensed by a sense amplifier coupled to the one bank array from which the data is to be read, and is stored in the read data latches. The codeword CW stored in the read data latches may be provided to the memory controller 100 via the data I/O buffer 295 after ECC decoding is performed on the codeword CW by a corresponding a second error correction circuit. The main data MD to be written in one bank array of the first through eighth bank arrays 310-380 may be provided to the data I/O buffer 295 from the memory controller 100 is written in one bank array along with a third parity data by the write drivers after an ECC encoding is performed on the main data MD to generate the third parity data by a corresponding second error correction circuit.

The data I/O buffer 295 may provide the main data MD from the memory controller 100 to the error correction circuit block 400 in a write operation of the semiconductor memory device 200, based on the clock signal CLK and may provide the main data MD from the error correction circuit block 400 to the memory controller 100 in a read operation of the semiconductor memory device 200.

One of the I/O gating circuits in the I/O gating circuit block 290, in a first write operation mode, may select a sub-page of a target page in one bank array, may read a first unit of data including the first sub unit of data, the second sub unit of data and the first parity data from the sub-page, and may provide the first unit of data to a corresponding second error correction circuit of the second error correction circuits 400a-400h.

The corresponding second error correction circuit of the second error correction circuits 400a-400h, in the first write operation mode, may perform an ECC decoding on the first unit of data to generate syndrome data, may generate a second parity data based on a portion of the first unit of data, may generate third parity data based on the write parity data WP associated with the main data MD to be written in the sub-page, the second parity data and the syndrome data, and may write back the main data MD and the third parity data in the sub-page, which is referred to as an internal read-modify-write operation.

Each of second error correction circuits 400a-400h, in a second write operation mode, may write the main data MD and the write parity data WP in a memory region of a corresponding bank array.

In addition, each of the second error correction circuits 400a-400h in the error correction circuit block 400, in the read operation, may receive the codeword CW, read from one bank array, from the I/O gating circuit block 290. The each of the second error correction circuits 400a-400h may perform an ECC decoding on the main data MD based on the parity data in the codeword CW, may correct at least one error bit in the main data MD and may provide corrected main data to the data I/O buffer 295.

The control logic circuit 210 may control operations of the semiconductor memory device 200. For example, the control logic circuit 210 may generate control signals for the semiconductor memory device 200 in order to perform a write operation or a read operation. The control logic circuit 210 includes a command decoder 211 that decodes the command CMD received from the memory controller 100 and a mode register 212 that sets an operation mode of the semiconductor memory device 200.

For example, the command decoder 211 may generate the control signals corresponding to the command CMD by decoding a write enable signal, a row address strobe signal, a column address strobe signal, a chip select signal, etc. The control logic circuit 210 may generate a first control signal CTL1 to control the I/O gating circuit block 290 and a second control signal CTL2 to control the error correction circuit block 400.

Figure 4:
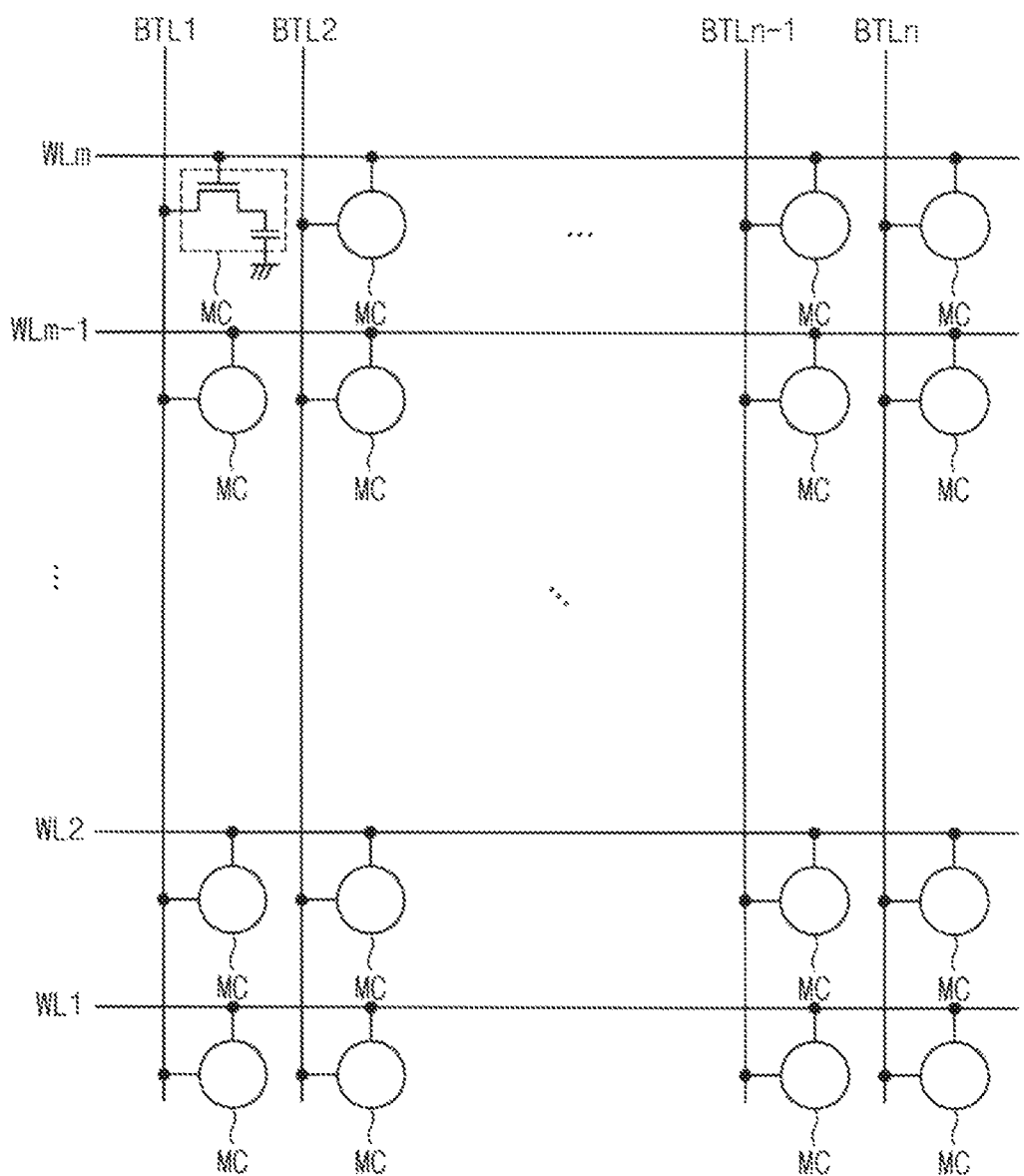
FIG. 4 illustrates an example of the first bank array in the semiconductor memory device of FIG. 3.

FIG. 4 illustrates an example of the first bank array in the semiconductor memory device of FIG. 3.

Referring to FIG. 4, the first bank array 310 a plurality of word-lines WL1-WLm (where m is a natural number greater than two), a plurality of bit-lines BTL1-BTLn (where n is a natural number greater than two), and a plurality of memory cells MCs disposed at intersections between the word-lines WL1-WLm and the bit-lines BTL1-BTLn. Each of the memory cells MCs includes a cell transistor coupled to each of the word-lines WL1-WLm and each of the bit-lines BTL1-BTLn and a cell capacitor coupled to the cell transistor.

Figure 5:
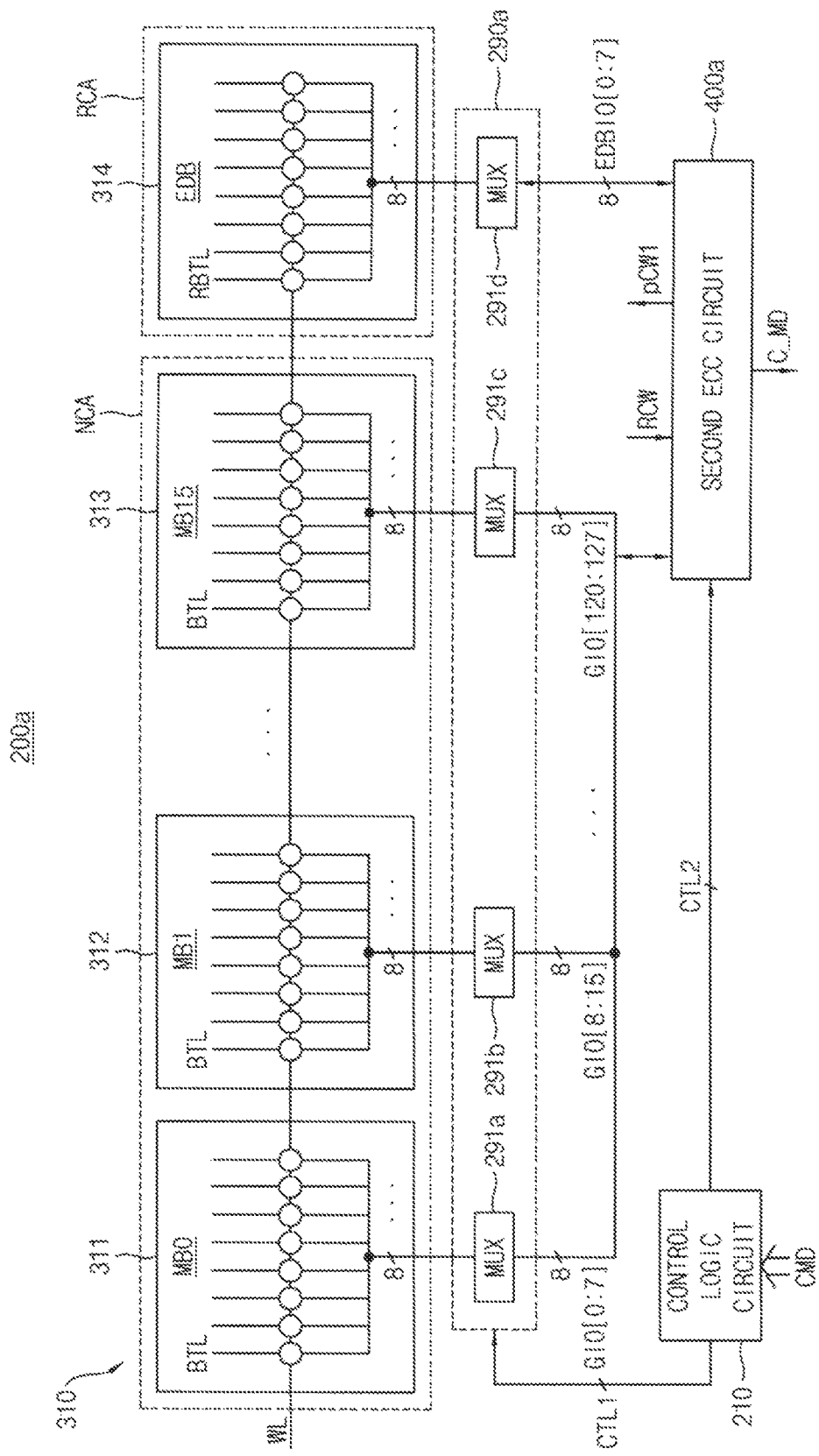
FIG. 5 illustrates a portion of the semiconductor memory device of FIG. 3 during a read operation.

FIG. 5 illustrates a portion of the semiconductor memory device of FIG. 3 during a read operation.

In FIG. 5, the control logic circuit 210, the first bank array 310, the I/O gating circuit 290a, and the second error correction circuit 400a are illustrated.

Referring to FIG. 5, the first bank array 310 includes a normal cell array NCA and a redundancy cell array RCA. The normal cell array NCA includes a plurality of first memory blocks MB0-MB15, i.e., 311-313, and the redundancy cell array RCA includes at least a second memory block 314. The first memory blocks 311-313 are memory blocks determining a memory capacity of the semiconductor memory device 200. The second memory block 314 is for ECC and/or redundancy repair. Since the second memory block 314 for ECC and/or redundancy repair is used for ECC, data line repair and block repair to repair "fail" cells generated in the first memory blocks 311-313, the second memory block 314 is also referred to as an EDB block.

In each of the first memory blocks 311-313, a plurality of first memory cells are arranged in rows and columns. In the second memory block 314, a plurality of second memory cells are arranged in rows and columns. The first memory cells connected to intersections of the word-lines WL and the bit-lines BTL may be dynamic memory cells. The second memory cells connected to intersections of the word-lines WL and bit-lines RBTL may be dynamic memory cells.

The I/O gating circuit 290a includes a plurality of switching circuits 291a-291d respectively connected to the first memory blocks 311-313 and the second memory block 314. In the semiconductor memory device 200, bit lines corresponding to data of a burst length (BL) may be simultaneously accessed to support the BL indicating the maximum number of column positions that is accessible. For example, the BL may be set to 8.

The second error correction circuit 400a may be connected to the switching circuits 291a-291d through first data lines GIO[0:127] and second data lines EDBIO[0:7].

The control logic circuit 210 may decode the command CMD to generate the first control signal CTL1 for controlling the switching circuits 291a-291d and the second control signal CTL2 for controlling the second error correction circuit 400a.

When the command CMD is a read command, the control logic circuit 210 provides the first control signal CTL1 to the I/O gating circuit 290a such that the first unit of a read codeword RCW stored in a sub-page of a page in the first bank array 310 is provided to the second error correction circuit 400a.

The second error correction circuit 400a, in response to the second control signal CTL2, performs the read-modify-write operation on the first unit of the read codeword RCW. In an example embodiment, the second error correction circuit 400a corrects an error bit of a sub unit of data in the read codeword RCW using the parity data in the read codeword RCW, writes back the corrected sub unit of data (e.g., a partial codeword pCW1) into a memory location corresponding to the sub unit of data of the sub-page in the first bank array 310, and may provide corrected main data C_MD to the memory controller 100 via the data I/O buffer 295.

The I/O gating circuit 290a and the second error correction circuit 400a may perform the read-modify-write operation sequentially on a plurality of sub-pages in one page of the memory cells in the first bank array 310 under control of the control logic circuit 210.

Figure 6:
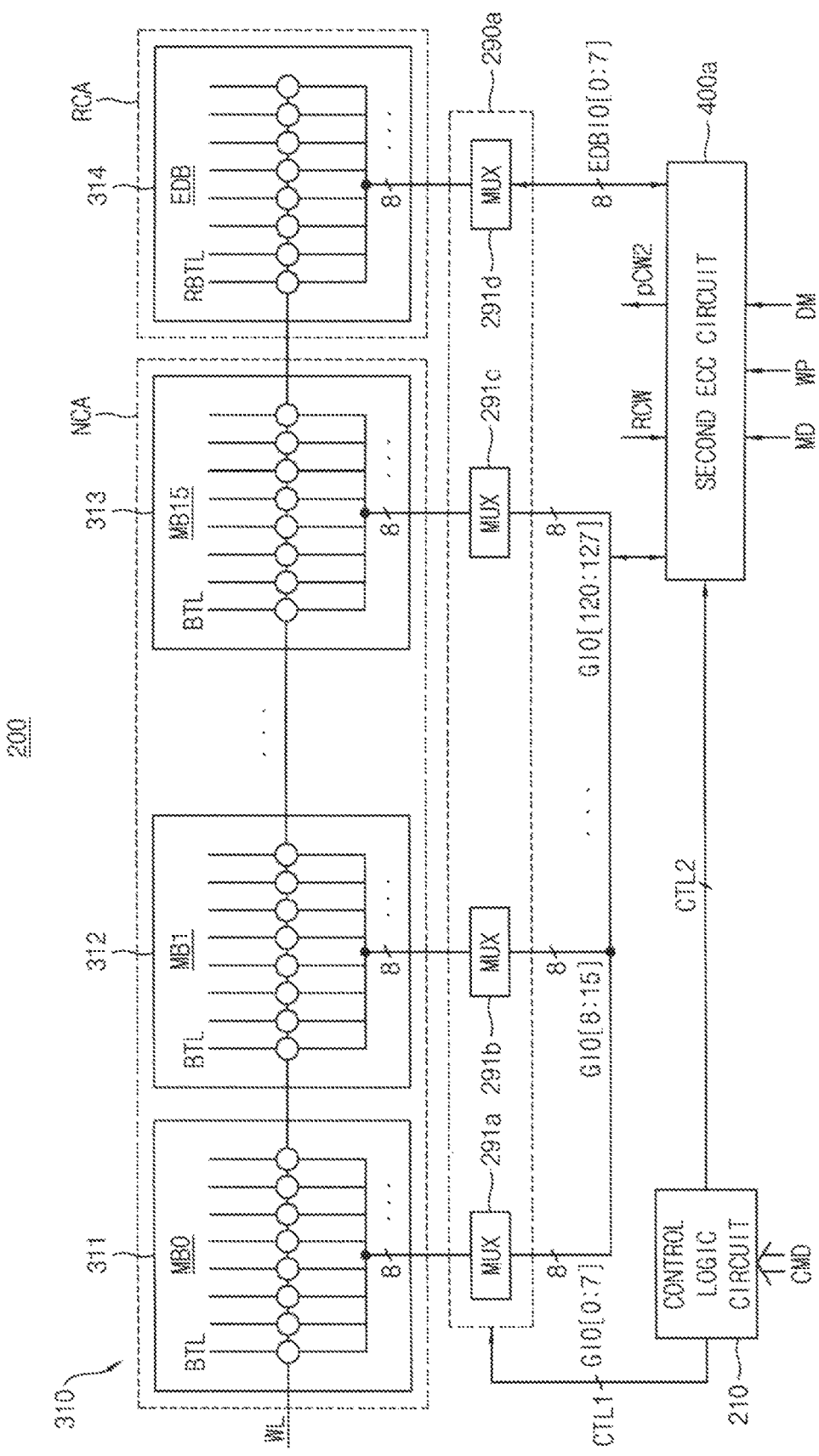
FIG. 6 illustrates a portion of the semiconductor memory device of FIG. 3 in a write operation mode.

FIG. 6 illustrates a portion of the semiconductor memory device of FIG. 3 in a write operation mode.

Referring to FIG. 6, when the command CMD designates a first write operation mode, the control logic circuit 210 provides the first control signal CTL1 to the I/O gating circuit 290a such that the first unit of a read codeword RCW stored in a sub-page of a page in the first bank array 310 is provided to the second error correction circuit 400a.

In an example embodiment, the second error correction circuit 400a, in response to the second control signal CTL2, performs an ECC decoding on the first unit of the read codeword RCW to generate a syndrome data, generates a second parity data based on a portion of the first unit of the read codeword RCW, generates third parity data based on the second parity data, the syndrome data and the write parity data WP associated with the main data MD to be written in the sub-page, and write a partial codeword pCW2 in the sub-page, which is referred to as an internal read-modify-write operation.

Figure 7:
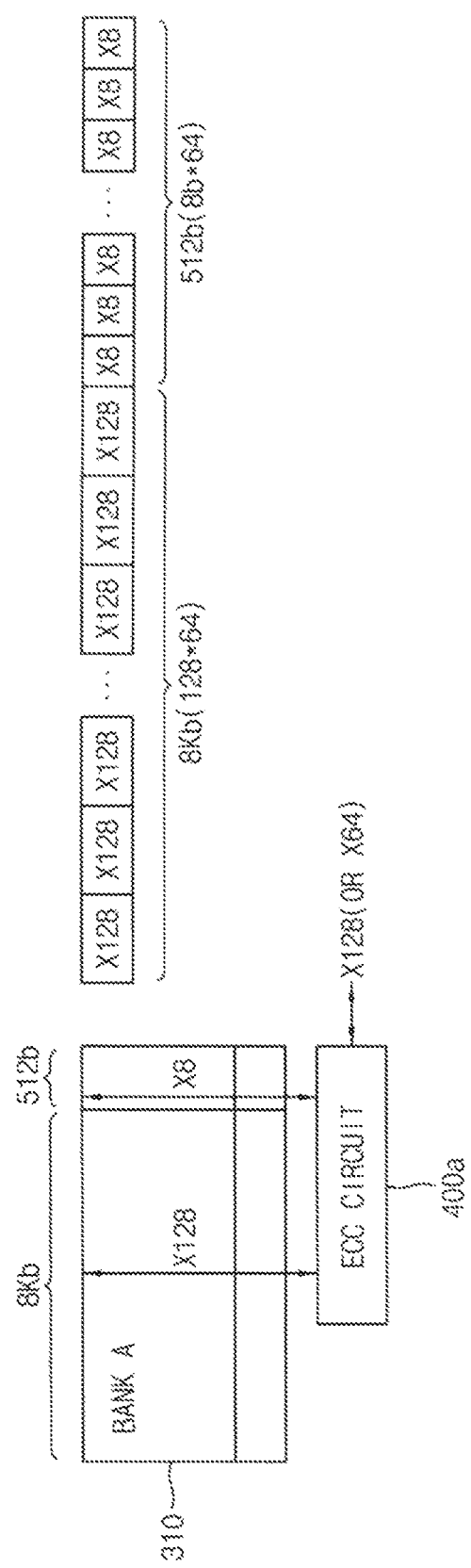
FIG. 7 illustrates a bank array and the second error correction circuit shown in the semiconductor memory device of FIG. 3.

FIG. 7 illustrates a bank array and the second error correction circuit shown in the semiconductor memory device of FIG. 3.

In FIG. 7, the first bank array 310 is illustrated for convenience, however, the details discussed herein related to the first bank array 310 may be applied to the other bank arrays 320-380.

Referring to FIG. 7, each page of the first bank array 310 has a size of 8 Kb and each sub-page of the page has a size of 128 bits. Parity data of 8 bits is stored for each sub-page. Data from each sub-page having a size of 128 bits and corresponding parity data having a size of 8 bits are sequentially read and provided to the second error correction circuit 400a.

Figure 8:
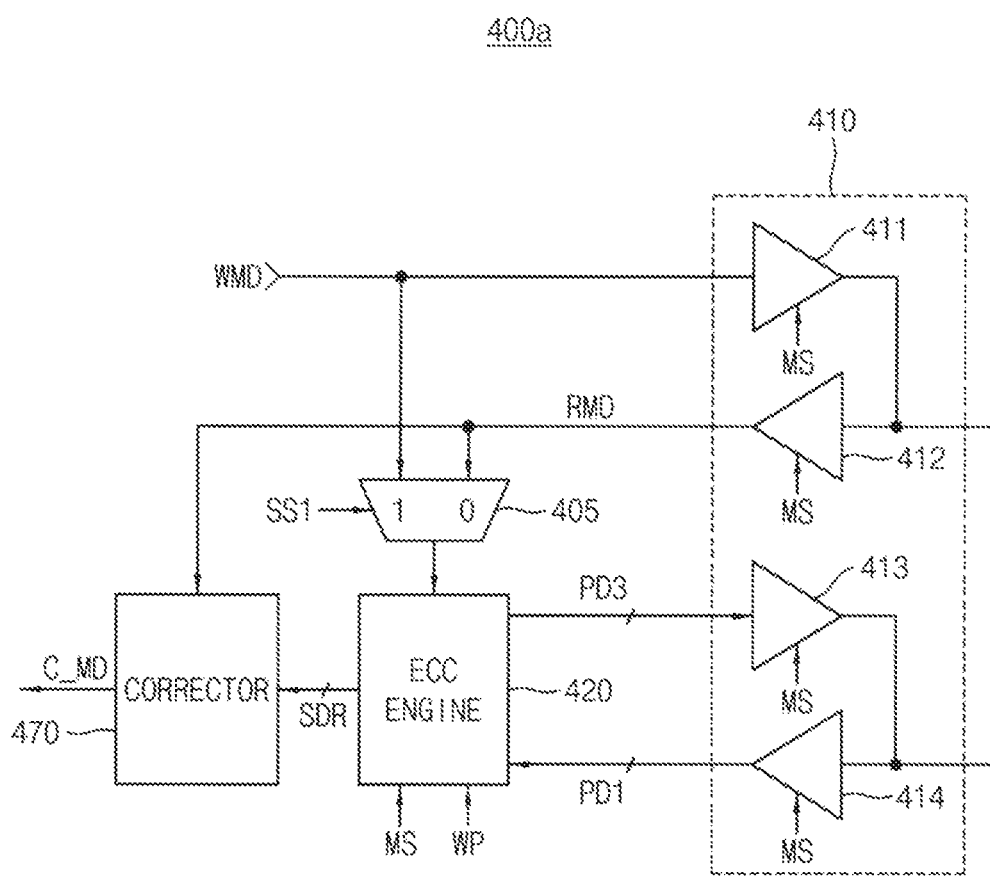
FIG. 8 is a block diagram illustrating the second error correction circuit shown in FIG. 3 according to an example embodiment.

FIG. 8 is a block diagram illustrating the second error correction circuit shown in FIG. 3 according to an example embodiment.

Referring to FIG. 8, the second error correction circuit 400a includes a multiplexer 405, an ECC engine 420, a buffer unit 410 and a data corrector 470. The buffer unit 410 may include first through fourth buffers 411-414.

The multiplexer 405, in the second write operation, provides the ECC engine 420 with a write data WMD in response to a first selection signal SS1. The multiplexer 405, in the read operation and the second write operation, provides the ECC engine 420 with a read data RMD from the buffer 412 in response to the first selection signal SS1. For example, the first selection signal SS1 may be a first logic level during the second write operation and a second other logic level during the read operation and the first write operation.

In an example embodiment, the buffers 411 and 413 are enabled during the write operation in response to a mode signal MS and provide the write data WMD and the parity data PD3 to the I/O gating circuit 290a. In an example embodiment, the buffers 412 and 414 are enabled during the read operation in response to the mode signal MS, the buffer 412 provides the read data RMD to the multiplexer 405 and the data corrector 470 and the buffer 414 provides the first parity data PD1 to the ECC engine 420.

In an example embodiment, the ECC engine 420, during the first write operation, generates a third parity data PD3 based on the write parity data WP, the first parity data PD1 and the read data RMD and provides the third parity data PD3 to the buffer 413. In an example embodiment, the ECC engine 420, during the read operation, performs an ECC decoding on the read data RMD from the multiplexer 405 based on the first parity data PD1 from the buffer 414 to provide syndrome data SDR to the data corrector 470.

The data corrector 470 corrects an error bit in the read data RMD based on the syndrome data SDR from the ECC engine 420 to provide corrected main data C_MD. In FIG. 8, the first selection signal SS1 and the mode signal MS may be included in the second control signal CTL2 from the control logic circuit 210.

Figure 9:
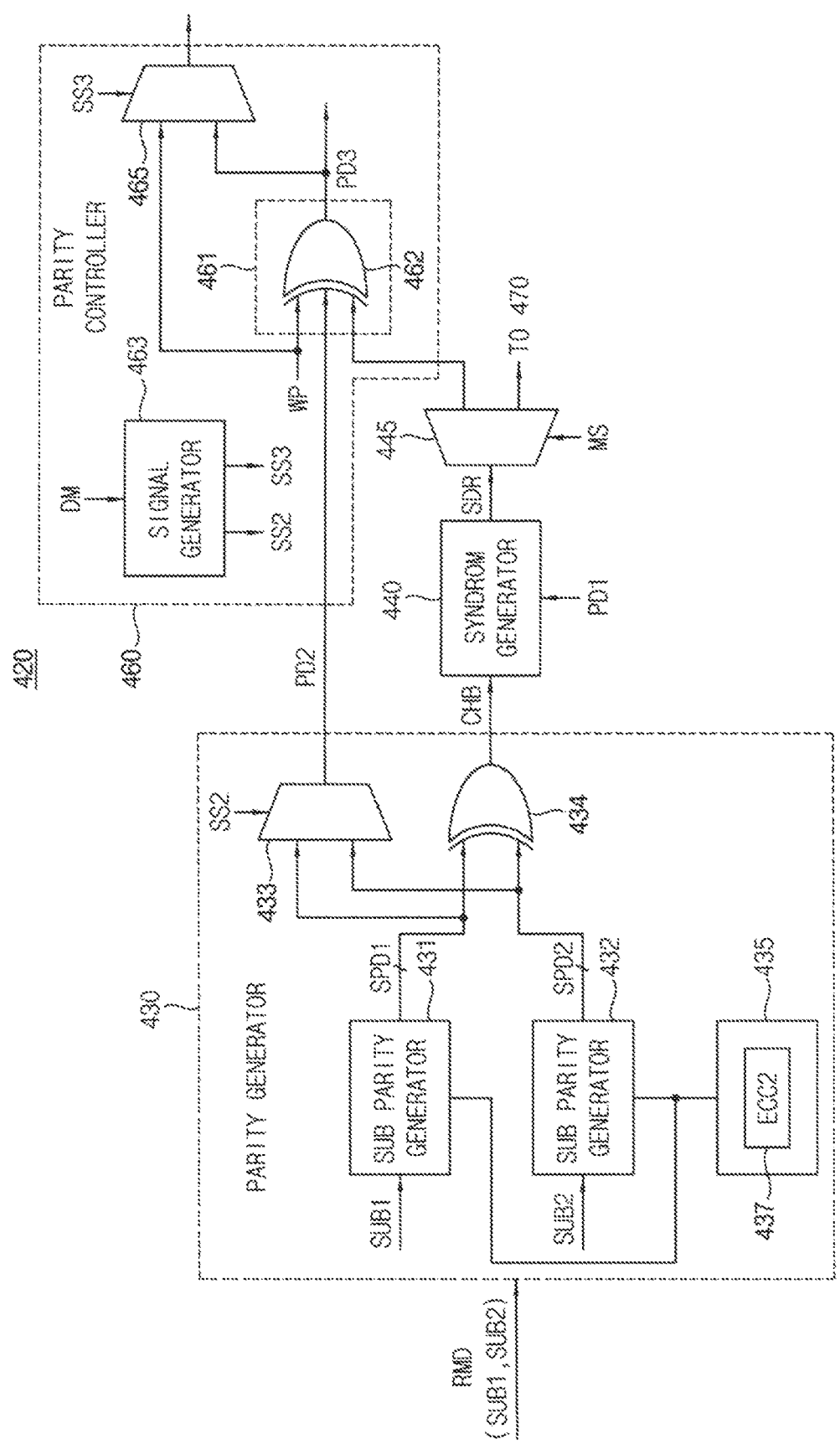
FIG. 9 illustrates an ECC engine in the second error correction circuit of FIG. 8 according to an example embodiment.

FIG. 9 illustrates an ECC engine in the second error correction circuit of FIG. 8 according to an example embodiment.

Referring to FIG. 9, the ECC engine 420 includes a parity generator 430, a syndrome generator 440, a demultiplexer 445 and a parity controller 460.

The parity generator 430 includes a first sub parity generator 431, a second sub parity generator 432, a multiplexer 433, an exclusive OR gate 434 and a memory 435 that stores a second ECC 437. The memory 435 is coupled to the first sub parity generator 431 and the second sub parity generator 432. The second ECC 437 may be represented as a generation matrix and may be same as (i.e., identical to) the first ECC 117.

The first sub parity generator 431 generates a first sub parity data SPD1 based on a first sub unit of data SUB1 of the read data RMD by using the second ECC 437. The second sub parity generator 432 generates a second sub parity data SPD2 based on a second sub unit of data SUB2 of the read data RMD by using the second ECC 437. The exclusive OR gate 434 (i.e., a first exclusive OR gate) performs exclusive OR operation on each corresponding bits of bits of the first sub parity data SPD1 and bits of the second sub parity data SPD2 to generate check bits CHB. The multiplexer 433 selects one of the first sub parity data SPD1 and the second parity data SPD2 to output the second parity data PD2 in response to a selection signal SS2.

The syndrome generator 440 generates syndrome data SDR based on the check bits CHB and the first parity data PD1 and provides the syndrome data SDR to the demultiplexer 445. Bits of the syndrome data SDR may indicate a position and a number of at least one error bit in the read data RMD. The demultiplexer 445 provides the syndrome data SDR to the data corrector 470 in the read operation and provides the syndrome data SDR to the parity controller 460 in the first write operation (mode).

The parity controller 460 includes a parity merger 461, a signal generator 463 and a multiplexer 465. The parity merger 461 merges the second parity data PD2, the write parity data WP and the syndrome data SDR to generate the third parity data PD3. The parity merger 461 may include an exclusive OR gate 462 (i.e., a second exclusive OR gate) and may perform exclusive OR operation on corresponding bits of the bits of the second parity data PD2, bits of the write parity data WP, and bits of the syndrome data SDR to output bits of the third parity data PD3.

The signal generator 463 may generate selection signals SS2 and SS3 in response to the data mask signal DM indicating whether the main data MD is masked, provide the selection signal SS2 to the multiplexer 433 and provide the selection signal SS3 to the multiplexer 465. The multiplexer 465 outputs one of the third parity data PD3 and the write parity data WP in response to the selection signal SS3.

When the data mask signal DM indicates that the main data MD is masked, the multiplexer 465 outputs the third parity data PD3 in response to the selection signal SS3. When the data mask signal DM indicates that the main data MD is not masked, the multiplexer 465 outputs the write parity data WP in response to the selection signal SS3.

When the data mask signal DM indicates that data in the main data MD, corresponding to the second sub unit of data SUB2, the multiplexer 433 outputs the second sub parity data SPD2 in response to the selection signal SS2. When the data mask signal DM indicates that data in the main data MD, corresponding to the first sub unit of data SUB1, the multiplexer 433 outputs the first sub parity data SPD1 in response to the selection signal SS2. The data mask signal DM includes 2 bits and may indicate that the main data MD is not masked or one of the data corresponding to the first sub unit of data SUB1 and the data corresponding to the second sub unit of data SUB2 is masked.

When one of the first sub unit of data SUB1 and the second sub unit of data SUB2 includes an error bit, a corresponding bit of the second parity data PD2 and a corresponding bit of the syndrome data SDR may indicate the error bit, the third parity data PD3 may include bits corrected from the error bit.

Figure 10:
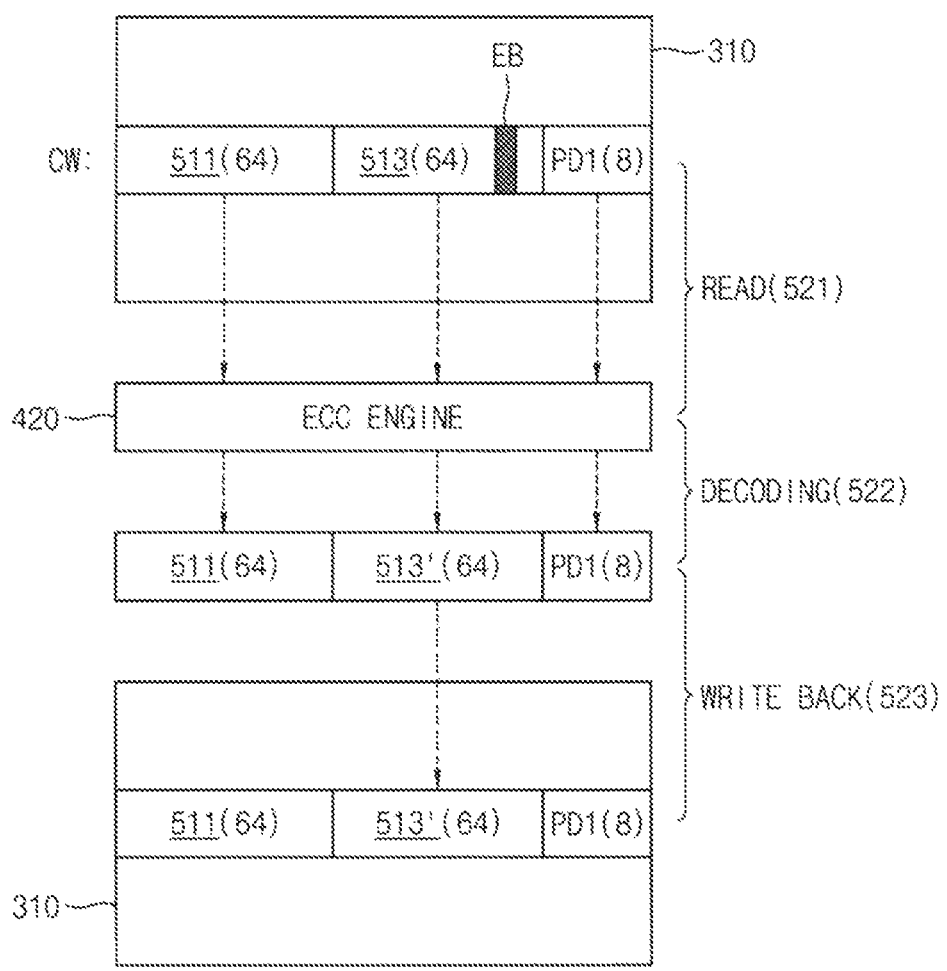
FIG. 10 illustrates that a read operation is performed in the semiconductor memory device in FIG. 5.

FIG. 10 illustrates that a read operation is performed in the semiconductor memory device in FIG. 5.

Referring to FIGS. 5 and 7 through 10, when the command CMD is a read command, the first unit of codeword CW including a 64-bit first sub unit of data 511, a 64-bit second sub unit of data 513 and an 8-bit first parity data PD1 is read from a sub-page of a page in the first bank array 310 and the first unit of codeword CW is provided to the ECC engine 420, as indicated by the reference numeral 521. For example, the first sub unit of data may be read from a first memory location of the sub-page, and the second sub unit of data may be read from a second memory location of the sub-page. The second sub unit of data 513 may include an error bit ER. The ECC engine 420 performs an ECC decoding on the first unit of codeword CW, corrects the error bit ER in the second sub unit of data 513 and provides the corrected second sub unit of data 513' to the I/O gating circuit 290a, as indicated by the reference numeral 522. The I/O gating circuit 290a writes back the corrected second sub unit of data 513' into a memory location corresponding to the second sub unit of data 513 of the sub-page (523) and provides the corrected main data to the data I/O buffer 295.

Figure 11:
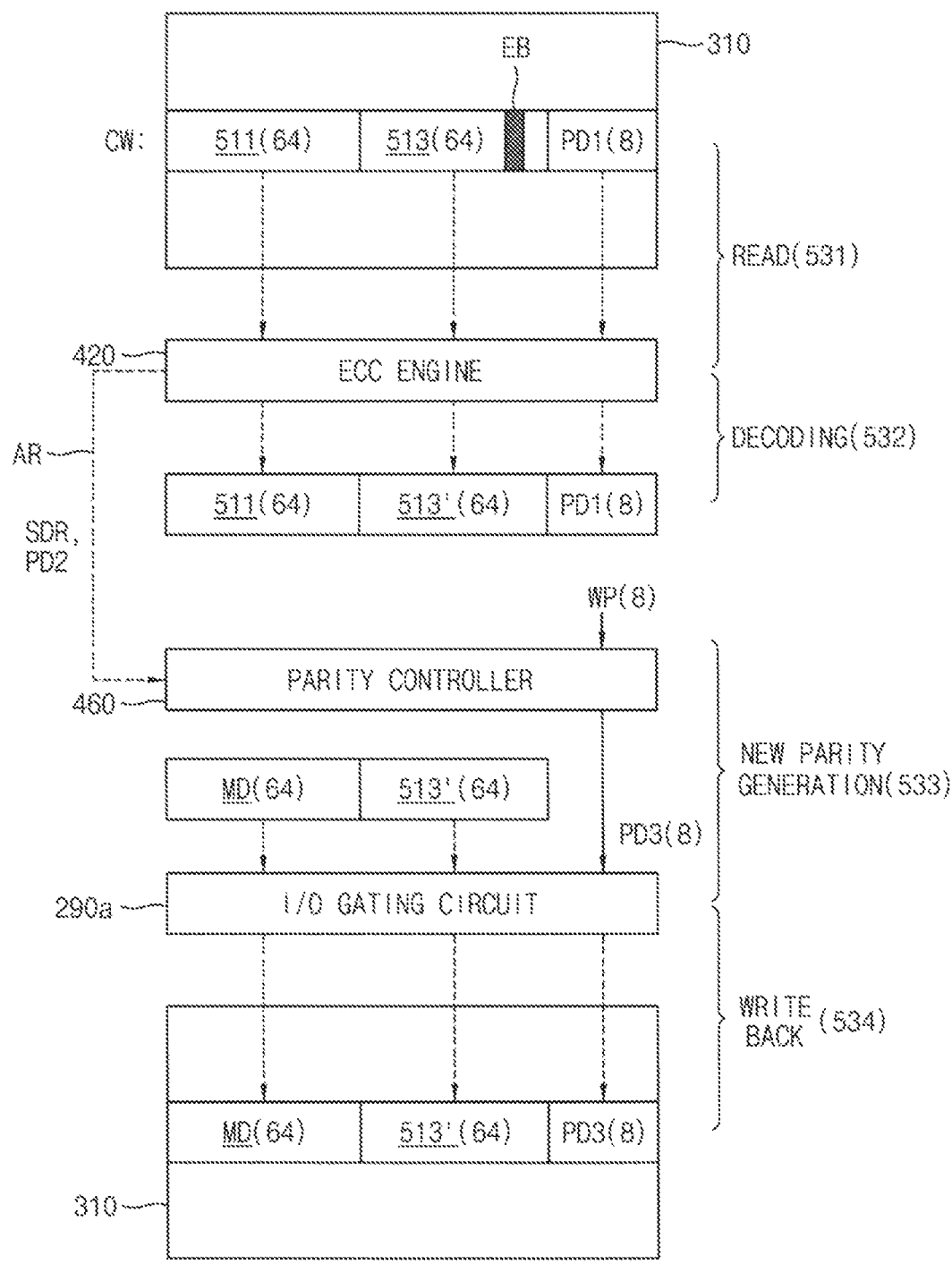
FIG. 11 illustrates that a write operation is performed in the semiconductor memory device in FIG. 6.

FIG. 11 illustrates that a write operation is performed in the semiconductor memory device in FIG. 6.

Referring to FIGS. 6 through 9 and 11, when the command CMD is a write command designating the first write operation, the first unit of the codeword CW including a 64-bit first sub unit of data 511, a 64-bit second sub unit of data 513 and a 8-bit first parity data PD1 is read from the sub-page of a page in the first bank array 310 and the first unit of codeword CW is provided to the ECC engine 420 as a reference numeral indicates 531. The second sub unit of data 513 may include an error bit ER. The ECC engine 420 performs an ECC decoding on the first unit of codeword CW, corrects the error bit ER in the second sub unit of data 513, generates the syndrome data SDR and the second parity data PD2 based on the first unit of codeword CW and provides the syndrome data SDR and the second parity data PD2 to the parity controller 460 as an arrow AR indicates.

The parity controller 460 generates the third parity data PD2 based on the syndrome data SDR, the second parity data PD and a 8-bit write parity data WP as a reference numeral indicates 533. The ECC engine 420 provides the main data MD to the I/O gating circuit 290a and the parity controller 460 provides the third parity data PD3 to the I/O gating circuit 290a. The I/O gating circuit 290a writes the main data MD and the third parity data PD3 in the sub-page as a reference numeral indicates 534. In this case, the I/O gating circuit 290a may write the corrected second sub unit of data 513' in the sub-page.

Therefore, according to example embodiments, when the semiconductor memory device 200 is to perform a masked write operation, the semiconductor memory device 200 receives the main data MD and the write parity data WP from the memory controller 100, and performs an internal read-modify-write operation by generating parity data and syndrome data based on a first unit of data read from a memory location in which the main data MD to be stored, and generating new parity data to be stored in the memory location based on the write parity data WP, the syndrome data and the parity data. Therefore, the semiconductor memory device 200 may enhance performance at a system level, may reduce power consumption and may decrease time to perform the internal read-modify-write operation because the semiconductor memory device 200 performs the write operation and error correction operation in response to one command.

Figure 12:
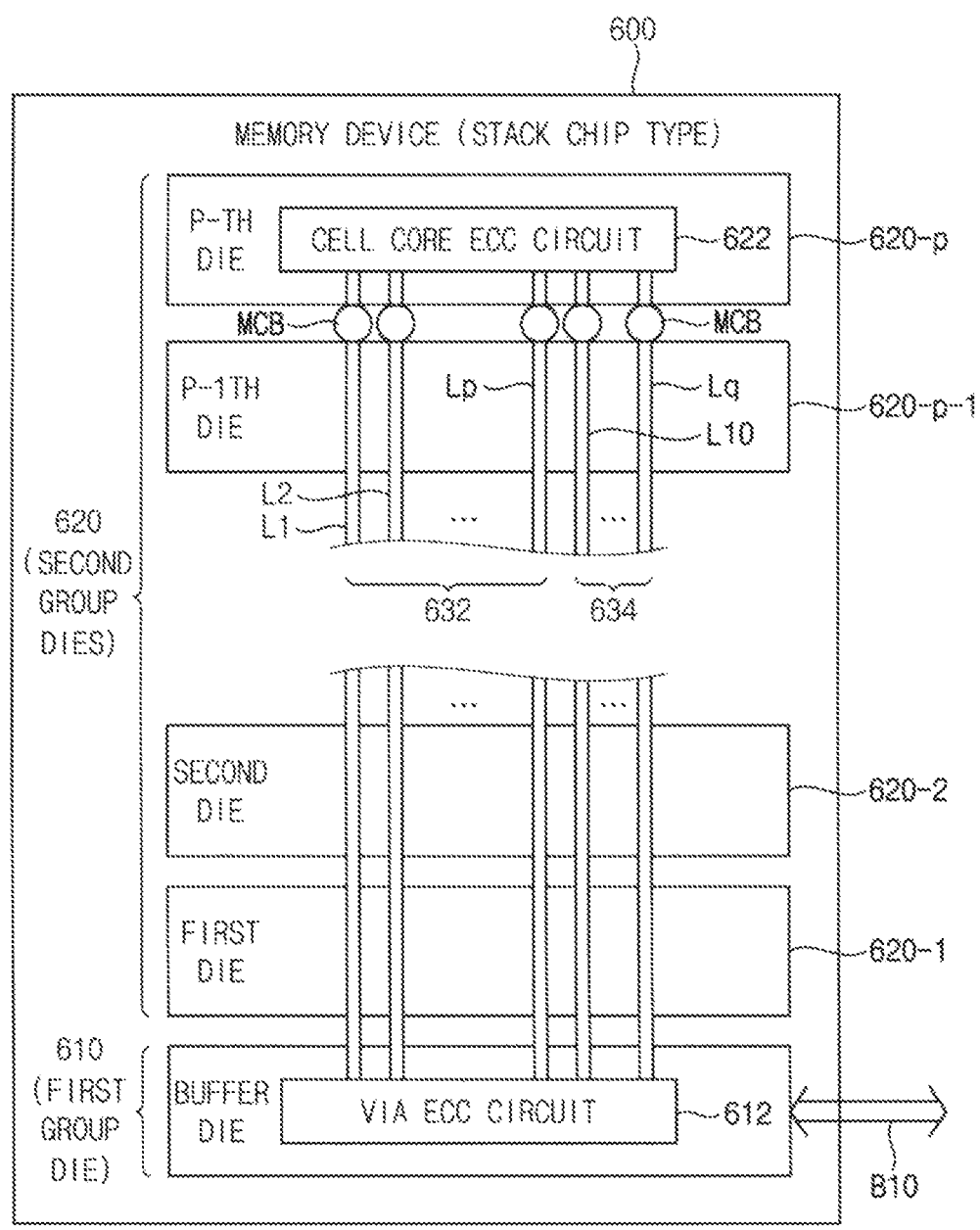
FIG. 12 is a block diagram illustrating a semiconductor memory device according to an example embodiment.

FIG. 12 is a block diagram illustrating a semiconductor memory device according to an example embodiment.

Referring to FIG. 12, a semiconductor memory device 600 may include a first group die 610 (e.g., a buffer die) and second group dies 620 providing a soft error analyzing and correcting function in a stacked chip structure. The second group dies 620 may be a high-bandwidth memory (HBM).

The first group die 610 may include at least one buffer die. The second group dies 620 may include a plurality of memory dies 620-1 to 620-p which is stacked on the first group die 610 and convey data through a plurality of through a plurality of silicon via (TSV) lines.

At least one of the memory dies 620-1 to 620-p may include a first type ECC circuit (i.e., a first type error correction circuit) 622 which generates transmission parity bits (i.e., transmission parity data) based on transmission data to be sent to the first group die 610. The first type error correction circuit 622 may be referred to as a cell core error correction circuit. The first type error correction circuit 622 may employ the second error correction circuit 400a of FIG. 8.

The buffer die may include a second type ECC engine (i.e., a second type error correction circuit or a via error correction circuit) 612 which corrects a transmission error using the transmission parity bits when a transmission error is detected from the transmission data received through the TSV lines and generate error-corrected data. The second type error correction circuit 612 may be referred to as a via error correction circuit or a via ECC circuit.

The semiconductor memory device 600 may be a stack chip type memory device or a stacked memory device which conveys data and control signals through the TSV lines. The TSV lines may also be called through electrodes.

As mentioned above, the first type error correction circuit 622 may perform internal read-write-modify operation to generate a third parity data based on the write parity and pre-stored codeword in the first write operation mode.

The first type error correction circuit 622 may perform error correction on data which is outputted from the memory die 620-p before the transmission data is sent.

A transmission error which occurs at the transmission data may be due to noise which occurs at the TSV lines. Since data fail due to the noise occurring at the TSV lines may be distinguishable from data fail due to a false operation of the memory die, it may be regarded as soft data fail (or a soft error). The soft data fail may be generated due to transmission fail on a transmission path, and may be detected and remedied by an ECC operation.

For example, when the transmission data is 64-bit data, the transmission parity bits may be set to 8 bits. However, the scope and spirit of the present disclosure are not limited thereto. The number of transmission parity bits may increase or decrease.

With the above description, a TSV line group 632 which is formed at one memory die 620-p may include 64 TSV lines L1 to Lp, and a parity TSV line group 634 may include 8 TSV lines L10 to Lq.

The TSV lines L1 to Lp of the data TSV line group 632 and the parity TSV lines L10 to Lq of the parity TSV line group 634 may be connected to micro bumps MCB which are correspondingly formed among the memory dies 620-1 to 620-p.

At least one of the memory dies 620-1 to 620-p may include DRAM cells each including at least one access transistor and one storage capacitor.

The semiconductor memory device 600 may have a three-dimensional (3D) chip structure or a 2.5D chip structure to communicate with the host through a data bus B10. The buffer die 610 may be connected with the host through the data bus B10.

The first type error correction circuit 622, denoted as the cell core ECC circuit, may output transmission parity bits as well as the transmission data through the parity TSV line group 634 and the data TSV line group 632 respectively. The outputted transmission data may be data which is error-corrected by the first type error correction circuit 622.

The second type error correction circuit 612, denoted as the via ECC circuit, may determine whether a transmission error occurs at the transmission data received through the data TSV line group 632, based on the transmission parity bits received through the parity TSV line group 634. When a transmission error is detected, the second type error correction circuit 612 may correct the transmission error on the transmission data using the transmission parity bits. When the transmission error is uncorrectable, the second type error correction circuit 612 may output information indicating occurrence of an uncorrectable data error.

When an error is detected from read data in a high-bandwidth memory (HBM) or the stacked memory structure, the error is an error occurring due to noise while data is transmitted through the TSV.

According to example embodiments, as illustrated in FIG. 12, the cell core error correction circuit 622 may be included in the memory die, and the second type error correction circuit 612 may be included in the buffer die. Accordingly, it may be possible to detect and correct soft data fail. The soft data fail may include a transmission error which is generated due to noise when data is transmitted through TSV lines.

Figure 13:
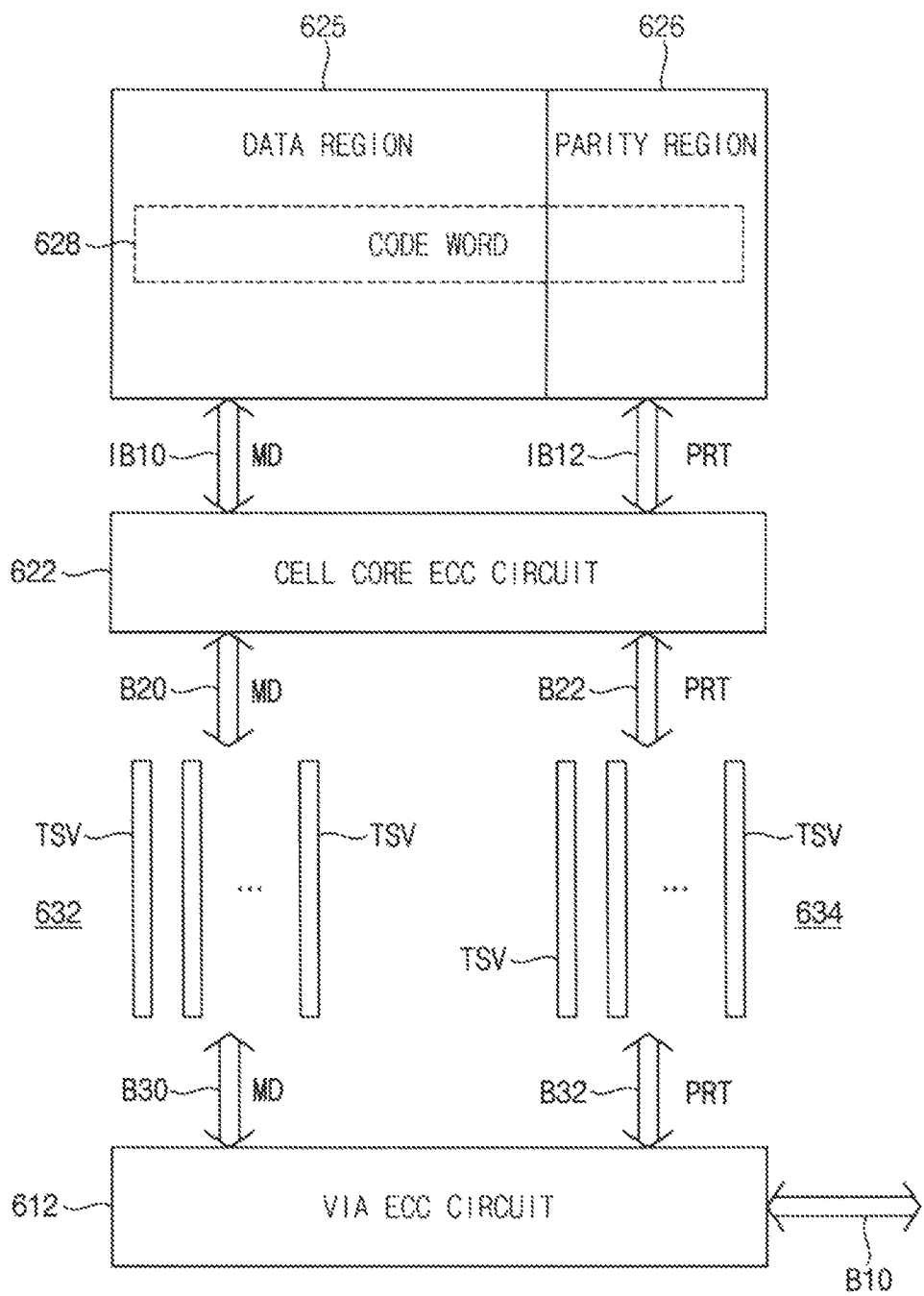
FIG. 13 is a diagram schematically illustrating connections between error correction circuits in FIG. 12.

FIG. 13 is a diagram schematically illustrating connections between error correction circuits in FIG. 12.

Referring to FIG. 13, the cell core error correction circuit 622 and the via the second type error correction circuit 612 may be connected through the data TSV line group 632 and the parity TSV line group 634.

More particularly, one memory die may include a memory cell array, and the memory cell array may include a data region 625 storing the main data MD and a parity region 626 storing the third parity data PD3.

In the case of reading data, a code word 628 may include main data MD from the data region 625 and parity data PRT (i.e., the first parity data) from the parity region 626. The cell core error correction circuit 622 may receive the main data MD through an internal data bus IB10 and the parity data PRT (the first parity data) through an internal parity bus IB12. The cell core error correction circuit 622 may check a read error on the main data MD using the parity data PRT and may perform error correction based on the checking result. The cell core error correction circuit 622 may receive the parity data PRT (i.e., write parity data) through a parity bus B22 to generate parity data PRT (i.e., the third parity data) in the first write operation mode.

The cell core error correction circuit 622 may output the error-corrected data as transmission data through a data bus B20 and may output transmission parity data through the parity bus B22. Here, the transmission parity data may be the same information as the third parity data PD3. The via the second type error correction circuit 612 may receive the transmission data through a data bus B30 and the transmission parity data through a parity bus B32. The data bus B20 and the data bus B30 may be implemented with the data TSV line group 632 described with reference to FIG. 12. The parity bus B22 and the parity bus B32 may be implemented with the parity TSV line group 634 described with reference to FIG. 12.

The via error correction circuit 612 may perform error checking on the transmission data received through the data TSV line group 632, based on the transmission parity data received through the parity TSV line group 634. When a transmission error is detected through the error checking, the second type error correction circuit 612 may correct the transmission error on the transmission data, based on the transmission parity data. For example, in the case where the number of correctable data bits is one, error correction may be impossible when the transmission error which includes two or more error bits occurs. In this case, the second type error correction circuit 612 may output information indicating occurrence of a data error to the data bus B10.

Figure 14:
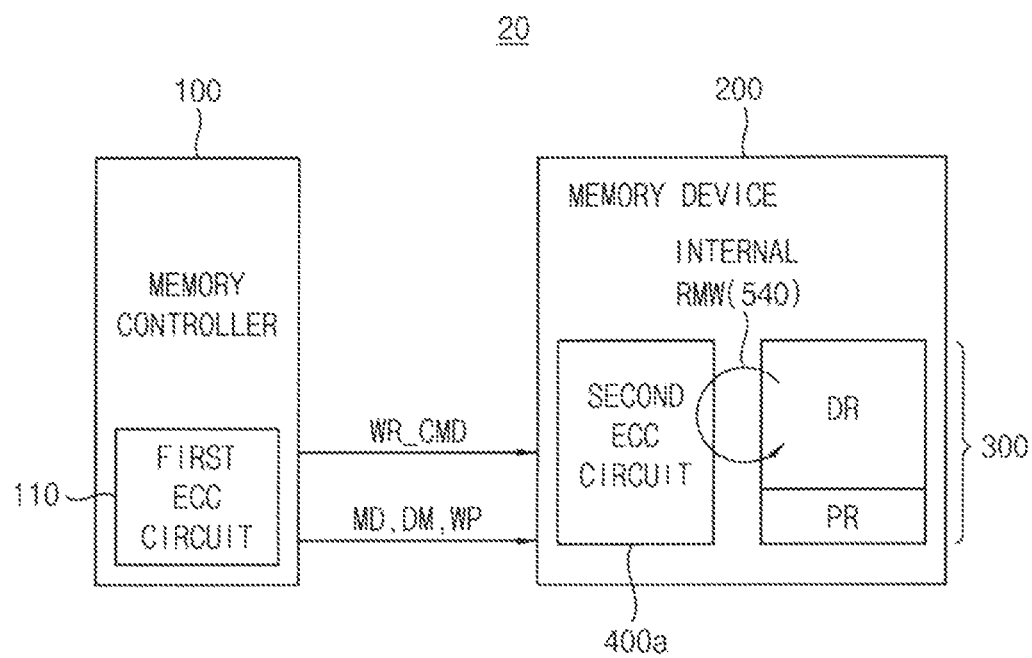
FIG. 14 illustrates that an internal read-modify-write operation is performed in response to a first command in the memory system of FIG. 1.

FIG. 14 illustrates that an internal read-modify-write operation is performed in response to a first command in the memory system of FIG. 1.

Referring to FIG. 14, the memory controller 100 applies a write command WR_CMD designating a first write operation mode, the main data MD, the write parity data WP and the data mask signal DM to the semiconductor memory device 200, and the semiconductor memory device 200 performs an internal read-modify-write operation 540 to write the main data MD in the data region DR of the memory cell array 300 and to write the third parity data in the parity region PR of the memory cell array 300 while correcting an error bit in the read data, in response to the write command WR_CMD. For example, the third parity data PD3 may be written in a third memory location from which the first parity data is read.

Figure 15:
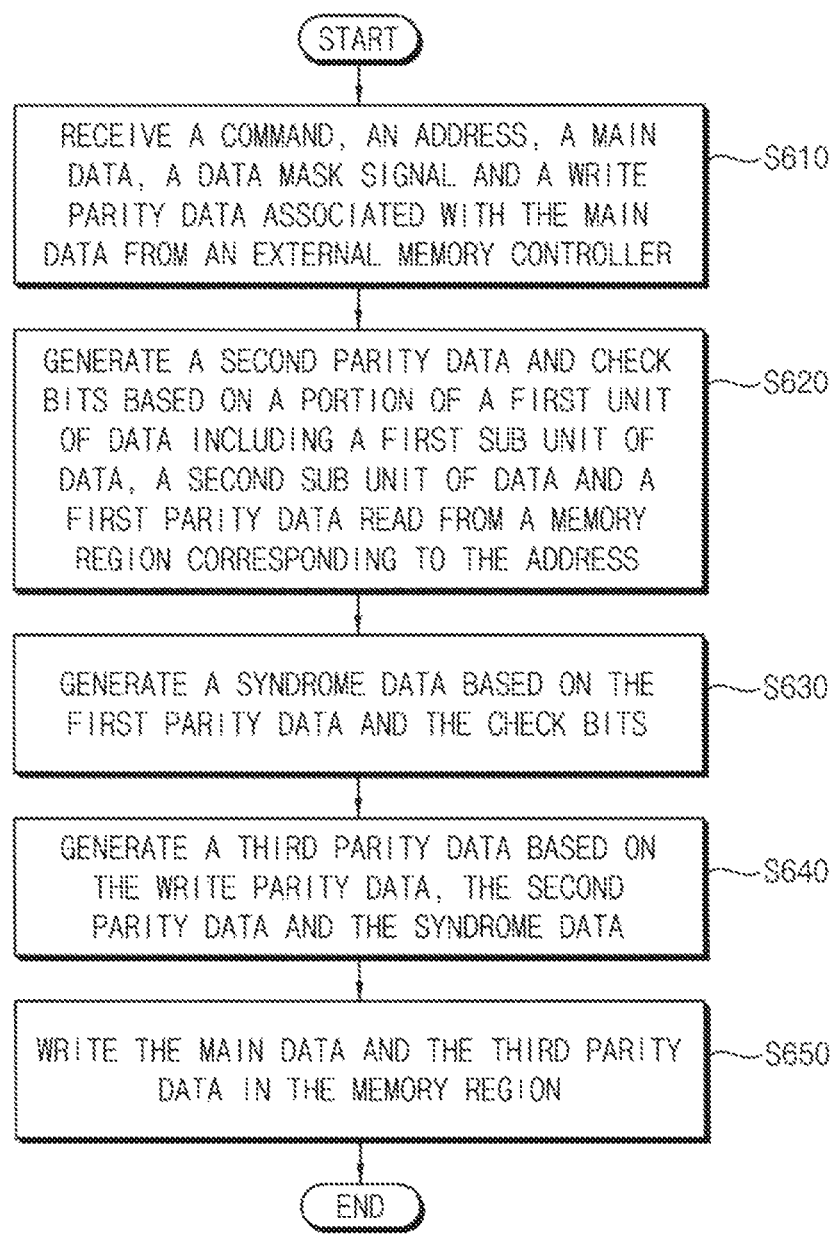
FIG. 15 is a flow chart illustrating a method of operating a semiconductor memory device according to an example embodiment.

FIG. 15 is a flow chart illustrating a method of operating a semiconductor memory device according to an example embodiment.

Referring to FIGS. 1 through 15, in a method of operating a semiconductor memory device 200 including a memory cell array 300, the semiconductor memory device 200 receives a command CMD, an address ADDR, a main data MD, a data mask signal DM and a write parity data WP associated with the main data MD from an external memory controller 100 (S610). An ECC engine 420 generates a second parity data PD2 and check bits CHB based on a portion of a first unit of data including a first sub unit of data, a second sub unit of data and a first parity data PD1, which is read from a memory region corresponding to the address ADDR (S620).

A syndrome generator 440 in the ECC engine 420 generates a syndrome data SDR based on the first parity data PD1 and the check bits CHB (S630). A parity controller 460 in the ECC engine 420 generates third parity data PD3 based on the write parity data WP, the second parity data PD2 and the syndrome data SDR (S640). A second error correction circuit 400a provides the main data MD and the third parity data PD3 to an I/O gating circuit 290a. The I/O gating circuit 290a writes the main data MD and the third parity data PD3 in the memory region corresponding to the address ADDR (S650).

The second parity data PD2 may be generated based on one of the first sub unit of data and the second sub unit of data in response to the data mask signal DM.

Figure 16:
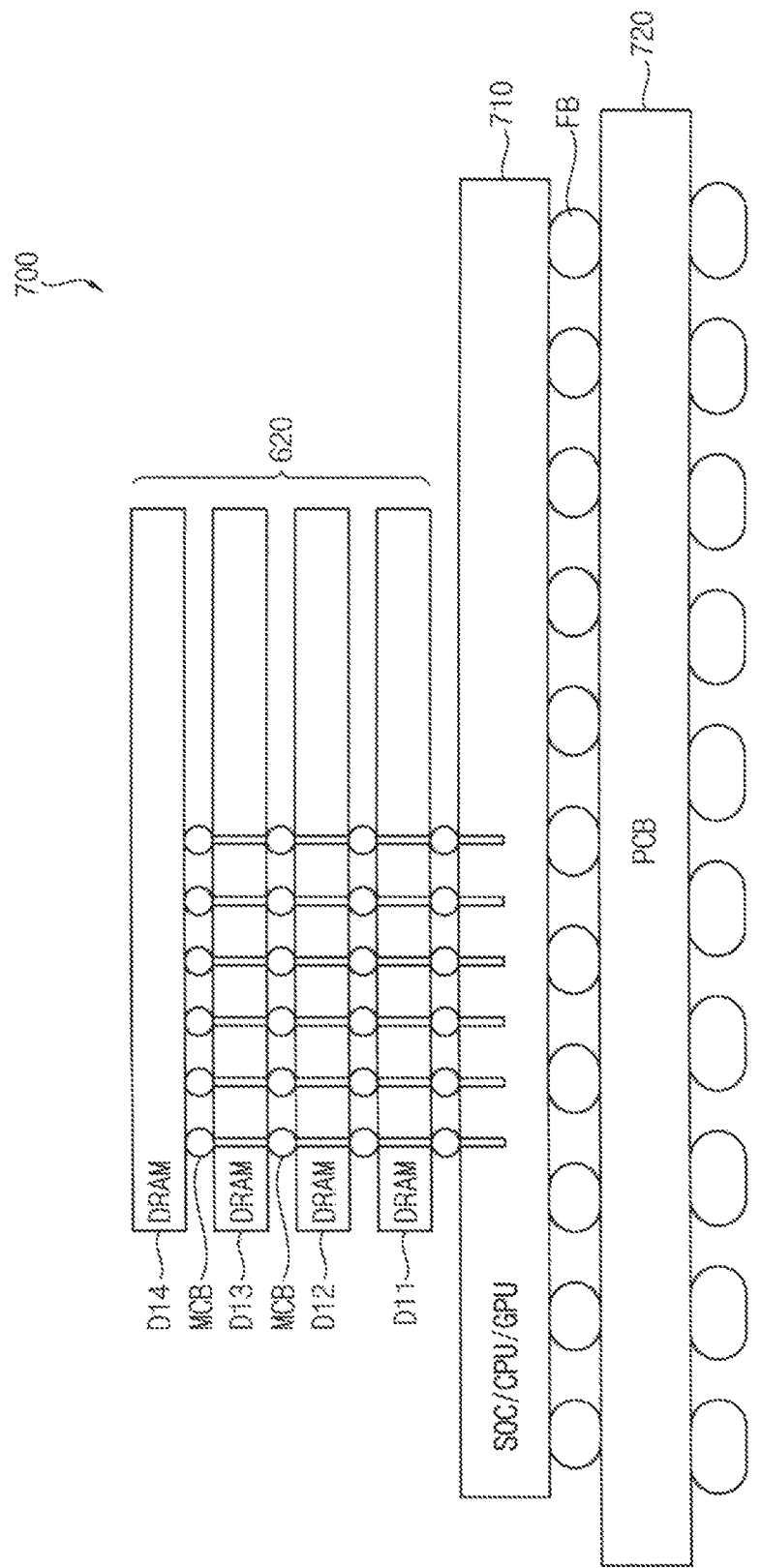
FIG. 16 is a cross-sectional view of a 3D chip structure employing the semiconductor memory device of FIG. 12 according to an example embodiment.

FIG. 16 is a cross-sectional view of a 3D chip structure employing the semiconductor memory device of FIG. 12 according to an example embodiment.

FIG. 16 shows a 3D chip structure 700 in which a host and a HBM are directly connected without an interposer layer.

Referring to FIG. 16, a host die 710 such as a system-on-chip (SoC), a central processing unit (CPU), or a graphic processing unit (GPU) may be disposed on a printed circuit board (PCB) 720 using flip chip bumps FB. Memory dies D11 to D14 may be stacked on the host die 720 to implement a HBM structure. In FIG. 16, the buffer die 610 or a logic die of FIG. 12 is omitted. However, the buffer die 610 or the logic die may be disposed between the memory die D11 and the host die 720. To implement the HBM (620) structure, TSV lines may be formed at the memory dies D11 and D14. The TSV lines may be electrically connected with micro bumps MCB placed between memory dies.

Figure 17:
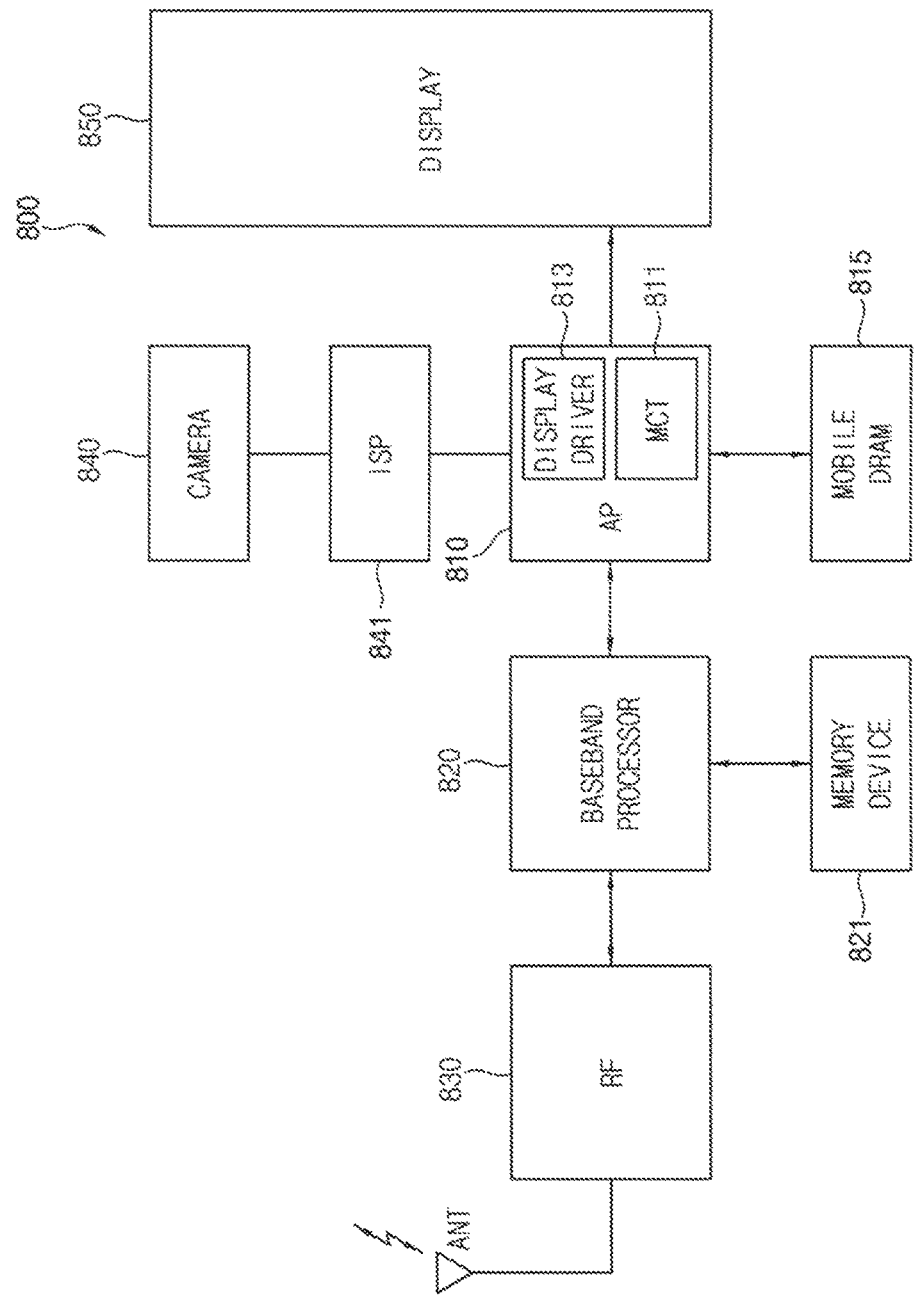
FIG. 17 is a block diagram illustrating a smart phone employing the semiconductor memory device according to an example embodiment.

FIG. 17 is a block diagram illustrating a smart phone employing the semiconductor memory device according to exemplary embodiments.

Referring to FIG. 18, a smart phone 800 may be implemented with a mobile computing device. An application processor (AP), for example, an application processor 810 (e.g., a mobile application processor) may control components 815, 820, 841, and 850 of the smart phone 800.

The application processor 810 may use a mobile DRAM 815 as a work memory (i.e., system memory). A memory device 821 may be used as a work and program memory of a baseband processor 820.

In FIG. 17, the mobile DRAM 815 may be implemented with the semiconductor memory device 200 of FIG. 3. A memory controller (MCT) 811 included in the application processor 810 may control access to the mobile DRAM 815. A display driver 813 included in the application processor 810 may control a display 850.

The baseband processor 820 may allow data to be exchanged between a wireless transceiver 830 and the application processor 810. Data processed by the baseband processor 820 may be sent to the application processor 810 or may be stored at the memory device 821. The memory device 821 may be implemented with a volatile memory or a nonvolatile memory.

Wireless data received through an antenna ANT may be transmitted to the baseband processor 820 by way of the wireless transceiver 830, and data outputted from the baseband processor 820 may be converted into wireless data by the wireless transceiver 830. The converted wireless data may be outputted through the antenna ANT.

The image signal processor 841 may process a signal from a camera (or an image sensor) 840 and may transfer the processed data to the application processor 810.

As mentioned above, according to example embodiments, when the semiconductor memory device is to perform a masked write operation, the semiconductor memory device receives the main data and the write parity data from the memory controller, and performs an internal read-modify-write operation by generating a parity data and a syndrome data based on a first unit of data read from a memory location in which the main data to be stored, and generating new parity data to be stored in the memory location based on the write parity data, the syndrome data and the parity data. Therefore, the semiconductor memory device may enhance performance at a system level, reduce power consumption and decrease the time required to perform the internal read-modify-write operation because the semiconductor memory device performs the write operation and error correction operation in response to one command.

Aspects of the present disclosure may be applied to systems using semiconductor memory devices.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims.

What is claimed is:

1. A semiconductor memory device comprising:
   a memory cell array;
   an error correction circuit;
   an input/output gating circuit (I/O gating circuit) connected to the error correction circuit and the memory cell array; and
   a control logic circuit configured to generate control signals by decoding a command received from an external memory controller,
   wherein the control logic circuit is, in a first write operation mode, configured to control the I/O gating circuit and the error correction circuit such that:
      the I/O gating circuit selects a sub-page of a target page, to read a first unit of data including (i) a first sub unit of data, (ii) a second sub unit of data and (iii) a first parity data from the sub-page, and provides the first unit of data to the error correction circuit; and
      the error correction circuit performs an error-correcting code (ECC) decoding on the first unit of data to generate syndrome data, to generate second parity data based on a portion of the first unit of data and to generate third parity data based on write parity data, the second parity data and the syndrome data,
      wherein the write parity data is provided from the external memory controller and is associated with main data to be written in the sub-page.

2. The semiconductor memory device of claim 1, wherein the first sub unit of data is read from a first memory location of the sub-page, and the second sub unit of data is read from a second memory location of the sub-page, and
   wherein the error correction circuit is further configured to, when the main data is written in the first memory location, generate the second parity data based on the second sub unit of data.

3. The semiconductor memory device of claim 2, wherein the error correction circuit is further configured to, when the second sub unit of data includes at least one error bit, correct the at least one error bit based on the syndrome data to provide a corrected second sub unit of data to the I/O gating circuit.

4. The semiconductor memory device of claim 2, wherein the control logic circuit is further configured to control the I/O gating circuit such that the main data is written in the first memory location and the third parity data is written in a third memory location from which the first parity data is read.

5. The semiconductor memory device of claim 1, wherein the first sub unit of data is read from a first memory location of the sub-page and the second sub unit of data is read from a second memory location of the sub-page, and
   wherein the error correction circuit is further configured to, when the main data is written in the second memory location, generate the second parity data based on the first sub unit of data.

6. The semiconductor memory device of claim 5, wherein the error correction circuit is further configured to, when the first sub unit of data includes at least one error bit, correct the at least one error bit based on the syndrome data to provide corrected first sub unit of data to the I/O gating circuit.

7. The semiconductor memory device of claim 5, wherein the control logic circuit is further configured to control the I/O gating circuit such that the main data is written in the second memory location and the third parity data is written in a third memory location from which the first parity data is read.

8. The semiconductor memory device of claim 1, wherein the external memory controller is further configured to generate the write parity data using a first error-correcting code (first ECC);
   wherein the error correction circuit is further configured to generate the second parity data using a second ECC which is identical to the first ECC; and
   wherein the memory cell array includes a plurality of dynamic memory cells, the plurality of dynamic memory cells being coupled to a plurality of word-lines and a plurality of bit-lines.

9. The semiconductor memory device of claim 1, wherein the error correction circuit is further configured to generate the third parity data further based on a data mask signal, and the data mask signal indicates whether the main data is masked.

10. The semiconductor memory device of claim 1, wherein the error correction circuit comprises:
    a parity generator configured to generate the second parity data and check bits based on the first sub unit of data and the second sub unit of data;
    a syndrome generator configured to generate the syndrome data based on the check bits and the first parity data; and a parity controller configured to generate the second parity data, the syndrome data, the write parity data and a data mask signal from the external memory controller.

11. The semiconductor memory device of claim 10, wherein the parity generator comprises:
   a first sub parity generator configured to generate a first sub parity data based on the first sub unit of data;
   a second sub parity generator configured to generate second sub parity data based on the second sub unit of data;
   an first exclusive OR gate configured to perform an exclusive OR operation on corresponding bits of the first sub parity data and the second sub parity data to generate the check bits; and
   a multiplexer configured to select one of the first sub parity data and the second parity data to output the second parity data in response to a selection signal,
   wherein the selection signal is generated based on the data mask signal.

12. The semiconductor memory device of claim 10, wherein the parity controller comprises:
   a parity merger configured to merge the second parity data, the write parity data and the syndrome data to generate the third parity data; and
   a signal generator configured to generate a selection signal in response to the data mask signal.

13. The semiconductor memory device of claim 12, wherein the parity merger comprises a second exclusive OR gate configured to perform an exclusive OR operation on corresponding bits of second sub parity data, the write parity data, and the syndrome data to output bits of the third parity data.

14. The semiconductor memory device of claim 1, further comprising:
   first group dies comprising at least one buffer die; and
   second group dies comprising a plurality of memory dies, the plurality of memory dies being stacked on the first group dies and conveying data through a plurality of through silicon via lines (plurality of TSV lines),
   wherein at least one of the plurality of memory dies includes the memory cell array and the error correction circuit,
   wherein the error correction circuit is further configured to generate transmission parity bits using transmission data to be sent to the first group dies,
   wherein the at least one buffer die includes a via error correction circuit configured to correct a transmission error using the transmission parity bits when the transmission error is detected from the transmission data received through the plurality of TSV lines, and
   wherein the semiconductor memory device is a high-bandwidth memory (HBM).

15. The semiconductor memory device of claim 14, wherein the error correction circuit is configured to correct an error that is output from the plurality of memory dies before the transmission data is sent to the at least one buffer die.

16. A memory system comprising:
   at least one semiconductor memory device; and
   a memory controller configured to control the at least one semiconductor memory device,
   wherein the at least one semiconductor memory device comprises:
      a memory cell array;
      an error correction circuit;
      an input/output gating circuit (I/O gating circuit) connected between the error correction circuit and the memory cell array; and
      a control logic circuit configured to generate control signals by decoding a command received from the memory controller,
   wherein the control logic circuit is, in a first write operation mode, configured to control the I/O gating circuit and the error correction circuit such that:
      the I/O gating circuit is configured to select a sub-page of a target page, to read a first unit of data including (i) a first sub unit of data, (ii) a second sub unit of data and (iii) a first parity data from the sub-page and configured to provide the first unit of data to the error correction circuit, and
      the error correction circuit is configured to perform an error-correcting code (ECC) decoding on the first unit of data to generate syndrome data, to generate second parity data based on a portion of the first unit of data and to generate third parity data based on a write parity data, the second parity data and the syndrome data, wherein the write parity data is provided from the memory controller and is associated with main data to be written in the sub-page.

17. The memory system of claim 16, wherein the memory controller comprises:
   an additional error correction circuit configured to generate the write parity data based on the main data using a first ECC, and
   wherein the error correction circuit is further configured to generate the second parity data using a second ECC which is identical to the first ECC.

18. The memory system of claim 16, wherein the first sub unit of data is read from a first memory location of the sub-page, and the second sub unit of data is read from a second memory location of the sub-page,
   wherein the error correction circuit is configured to, when the main data is written in the first memory location, generate the second parity data based on the second sub unit of data, and
   wherein the error correction circuit is configured to, when the main data is written in the second memory location, generate the second parity data based on the first sub unit of data.

19. The memory system of claim 16, wherein the error correction circuit comprises:
   a parity generator configured to generate the second parity data and check bits based on the first sub unit of data and the second sub unit of data;
   a syndrome generator configured to generate the syndrome data based on the check bits and the first parity data; and
   a parity controller configured to generate the second parity data, the syndrome data, the write parity data and a data mask signal from the memory controller.

20. A method of operating a semiconductor memory device including a memory cell array, the method comprising:
   receiving a command, an address, main data, a data mask signal and write parity data associated with the main data from an external memory controller;
   generating second parity data and check bits based on a portion of a first unit of data including (i) a first sub unit of data, (ii) a second sub unit of data and (iii) first parity data read from a memory region corresponding to the address;

generating syndrome data based on the first parity data and the check bits;
generating third parity data based on the write parity data, the second parity data and the syndrome data; and
writing the main data and the third parity data in the memory region corresponding to the address,
wherein the second parity data is generated based on one of the first sub unit of data and the second sub unit of data in response to the data mask signal.

* * * * *